United States Patent [19]

McDonald et al.

[11] 4,168,441

[45] Sep. 18, 1979

[54] PICOSECOND PULSE GENERATOR UTILIZING A JOSEPHSON JUNCTION

[75] Inventors: Donald G. McDonald; Robert L. Peterson, both of Boulder, Colo.

[73] Assignee: The United States of America as represented by the Secretary of the Navy, Washington, D.C.

[21] Appl. No.: 862,311

[22] Filed: Dec. 20, 1977

[51] Int. Cl.² .............................................. H03K 3/38
[52] U.S. Cl. .................... 307/277; 307/261; 307/306; 357/5; 331/107 S
[58] Field of Search .............. 307/261, 277, 306; 357/5; 331/107 S

[56] References Cited

U.S. PATENT DOCUMENTS

| | | | |
|---|---|---|---|
| 3,506,913 | 4/1970 | Lambe et al. | 307/306 X |
| 3,573,662 | 4/1971 | Fulton | 307/306 X |
| 3,573,759 | 4/1971 | Silver et al. | 307/306 X |
| 3,725,819 | 4/1973 | Fulton | 307/306 X |
| 3,758,854 | 9/1973 | Zimmerman | 307/306 X |

Primary Examiner—John Zazworsky
Attorney, Agent, or Firm—R. S. Sciascia; L. I. Shrago; C. E. Vautrain, Jr.

[57] ABSTRACT

A picosecond pulse generator for producing pulses having widths in the order of $10^{-12}$ seconds utilizes a Josephson junction that has an external load resistor connected in shunt therewith by a balanced transmission line. The Josephson junction is driven by a high frequency oscillator, and the AC current, $I_1$, flowing through it is adapted to have its amplitude varied with respect to $I_c$, the critical current of the junction. As the value of $I_1/I_c$ exceeds one and increases, first a single and then an increasing number of picosecond pulses are produced during each half cycle of the high frequency oscillator.

7 Claims, 4 Drawing Figures

PICOSECOND PULSE GENERATOR UTILIZING A JOSEPHSON JUNCTION

The present invention relates generally to apparatus for and methods of generating picosecond pulses and, more particularly, to superconducting arrangements for producing trains of electrical pulses having widths in the order of $10^{-12}$ seconds which utilize Josephson junctions.

The need for electrical pulses having pulse widths in the picosecond range has arisen as a consequence of the development of complex digital circuits such as, for example, analog-to-digital converters and computer circuitry which have stringent synchronizing requirements. Pulse widths in the order of $10^{-9}$ seconds or less are needed in these applications. Heretofore, picosecond pulses have been produced only by mode-locked lasers. However, optical carrier waves accompany these pulses. This carrier is a technical complication and inconvenience and must be removed if the pulses are to be used in electrical circuits.

It is, accordingly, a primary object of the present invention to provide apparatus for and methods of producing a continuous train of picosecond pulses.

Another object of the present invention is to provide an arrangement for generating electrical pulses having durations in the order of $10^{-12}$ seconds which utilize Josephson junctions.

Another object of the present invention is to provide a Josephson picosecond pulser wherein the pulse repetition rate is largely determined by the frequency stability of an oscillator driving the junction.

Another object of the present invention is to provide a circuit arrangement for generating pulses having a width in the order of $10^{-12}$ seconds which utilizes a Josephson junction excited or driven by a high frequency or microwave oscillator.

Other objects, advantages and novel features of the present invention will become apparent from the following detailed description of the invention when considered in conjunction with the accompanying drawings wherein.

Briefly, and in somewhat general terms, the above objects of invention are realized according to one embodiment of the invention by driving a Josephson junction which has an external resistance in parallel therewith with an alternating current that may be derived from a high frequency or microwave oscillator. As is well known, a Josephson junction can generate hundreds of harmonics of a microwave source, and the pulser of the present invention operates on the basis of the interference of these harmonics. In this regard, reference may be had to the article entitled Four-Hundredth-Order Harmonic Mixing of Microwave and Infrared Laser Radiation Using a Josephson Junction and a Maser by D. G. McDonald et al which appeared in the April 1972, Vol. 20, No. 8 issue of applied Physics Letters on pages 296–299.

The production of the pulses takes place when a resistor channel is provided for the current to flow in a path which is parallel to the Josephson junction. These pulses appear when the bias current $I_1$ just exceeds the critical current $I_c$ of the junction. While a DC current can be utilized, this type of bias is not of great interest because of its comparative inflexibility. Thus, the preferred method of driving the Josephson junction is with an alternating current which, as mentioned hereinbefore, may be derived from a stabilized high frequency or microwave oscillator. With such an oscillator for a certain range of $I_1/I_c$, the pulse generating circuit will produce a single pulse of each polarity. As the driving current $I_1$ is increased, multiple pulses appear for each polarity or half cycle of the driving period. The pulse repetition rate is largely determined by the frequency stability of the driving source, which source can be readily designed to possess the precision needed.

In describing the performance of the pulse generating circuit, the following dimensionless parameters are important: $I_1/I_c, \nu_1 \tau_g$, $R_J R_L$, $R_J C/\tau_g$, and $L/R_J \tau_g$, where $I_1$ and $I_c$ are the drive current amplitude and junction critical current; $\tau_1$ is the drive frequency and $\nu_g$ is the "energy gap time" $1/h/2\Delta$; $R_J$ and $R_L$ are the junction normal state resistance and external load resistance; and C and L are the junction capacitance and circuit inductance.

Figure 1:
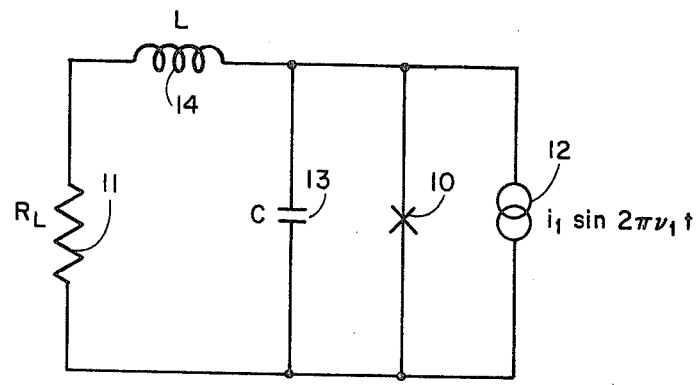
FIG. 1 is a schematic circuit showing the lumped elements which are present in the pulse generating circuit.

Referring now to FIG. 1 of the drawings which shows the picosecond pulse generator as a lumped element circuit, it will be seen that the Josephson junction 10 is driven by a high frequency or microwave source 12, here identified as providing $I_1\sin2\pi\nu_1\tau$. A loop circuit containing an external load resistor 11 is connected across Josephson junction 10 so as to form a channel for the current to flow in a path parallel to the junction. The inductance and capacitance of this loop is here represented by inductance 14 in series with resistor 11 and capacitance 13 shunting junction 10.

Figure 2:
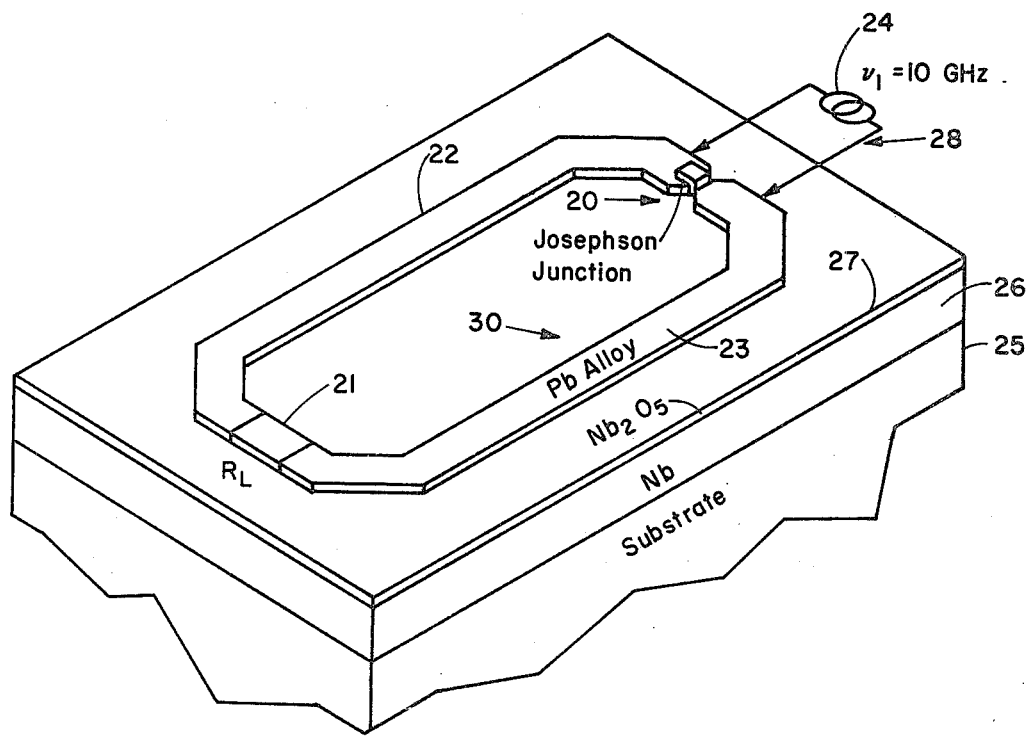
FIG. 2 illustrates one embodiment of the invention which may be used with high density integrated circuits.

FIG. 2 illustrates one modification of the present invention wherein the Josephson junction 20 is connected to an external load, here resistor 21, by a balanced transmission line 30 made up of microstriplines 22 and 23. Transmission line 30 and resistor 21 form an external loop for junction 20 and provide the resistor channel for the current to flow in a path parallel to the Josephson junction.

Junction 20 is driven by a high frequency or microwave source 24 which can be adapted through well known means to produce the variable amplitude bias current $I_1$. It should be appreciated that this source can supply different waveforms such as, for example, square waves to the Josephson junction, if desired.

The microstriplines 22 and 23, which form the balanced transmission lines in this modification are made of Pb alloy. They are deposited or otherwise layed down on an insulating layer 27 of $Nb_2O_5$ which is on an Nb ground plane 26. This plane is formed on a suitable substrate 25. The transmission line 30 should have an impedance $Zo=(\frac{1}{2}) R_L$ for matching purposes. The capacitance and inductance of the lines to the load resistor can be ignored except for the fact that they produce a circuit delay.

The microwave bias current from source 24, $I_1$, is supplied to the junction circuit through a high impedance balanced transmission line 28. Alternatively, it may be fed to this junction through a weak capacitance coupling arrangement.

Without a detailed analysis, one can understand how voltage pulses develop across the circuit of FIG. 2 when it is driven by an alternating bias current $I_1 \cos \omega\tau$. When the $\omega\tau \approx n\pi$, where $n = 0, 1, 2 \ldots$, the drive current slowly varies and appears momentarily as a DC drive of an amplitude of approximately $I_1$. The Josephson junction attempts to go into self-oscillation when $I_1$ becomes just larger than $I_c$ at a frequency given by the following:

$$\omega_j = (RI_c/\bar{\phi})(z^2 - 1)^{\frac{1}{2}} \tag{1}$$

where $$Z = I_1/I_c \tag{2}$$

and $$\bar{\phi} = 1/h/2e \tag{3}$$

and where $$1/R = (1/R_{int}) + (1/R_L) \tag{4}$$

The pulse width will be about $2\bar{\phi}/RI_c$. As $I_1$ increases, there may be time for more than one of these self-oscillations to be manifested. The reason for this is that the self-oscillation frequency as given by equation (1) increases. Hence, multiple pulses can appear on each half cycle of the driving period.

The following relation has been found to give the approximate value of $I_1$, $\omega$ or R for the best pulse configuration:

$$I_1(n) = I_c + 2n\bar{\phi}\omega/R = I_c(1 + n\omega\tau) \tag{5}$$

where n is the number of voltage pulses per half cycle.

Figure 3:
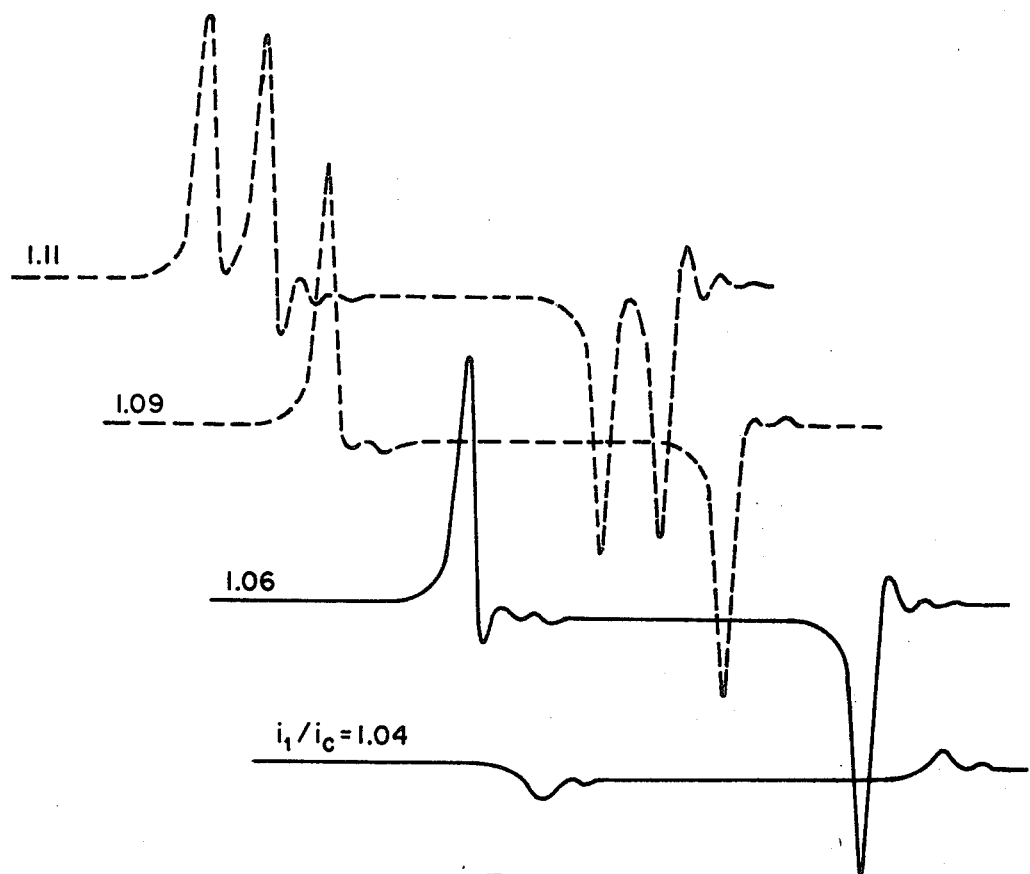
FIG. 3 illustrates the time dependence of steady-state voltage across the load resistor for a number of values of $I_1/I_c$.

FIG. 3 illustrates the time-dependent voltage occurring across the load resistance $R_L$ for various values of $I_1/I_c$. In general, the waveform is of low amplitude and nearly sinusoidal for $I_1/I_c < 1$, a condition which is not shown in this Fig. The onset of pulse behavior is very sharp occurring as $I_1/I_c$ exceeds a value near unity. This is followed by a range of $I_1/I_c$ designated as $\Delta I_1/I_c$ over which the single pulse produced is stable in both shape and amplitude. This is next followed by double and high order multiple pulses as $I_1/I_c$ is increased further and equals, for example, 1.11. These multiple pulses appear whenever the junction current exceeds the critical current for a time long enough to permit multiple self-oscillations. From a SQUID point of view, each pulse corresponds to the entry or exit of a fluxoid into a superconducting loop. The pulses of FIG. 3 appear simultaneously with a $2\pi$ phase shift of the pair phase-difference across the Josephson junction, just as in a SQUID. Thus, the pulser circuit of the present invention has manifestations of fluxoid quantization even though it is not an overall superconducting circuit.

A summary list of suitable pulser design parameters selected for Pb alloy technology, for the narrowness of the associated pulses, for large peak voltage $v_p$, and reasonable $\Delta I_1/I_c$, as well as for a variety of practical values of $R_JC/\tau_g$, is given in Table 1:

TABLE 1

| PULSE WIDTH (ps) | $\dfrac{R_JC}{\tau_g}$ | $R_J/R_L$ | $\dfrac{\Delta I_1}{I_c}$ | $ev_p/2\Delta$ | $B(GH_z)$ | d(nm) | $J_c(A/cm^2)$ | $\lambda_J(\mu m)$ |
|---|---|---|---|---|---|---|---|---|
| 4.7 | 10 | 8 | 0.08 | 0.15 | 150 | 3.04 | 600 | 12.6 |
| 2.2 | 2 | 4 | 0.06 | 0.31 | 450 | 2.02 | 4500 | 4.6 |
| 0.8 | 0.2 | 2 | 0.05 | 0.66 | 1090 | 0.56 | 162000 | 0.77 |

In the above table, d is the barrier thickness in nm, $J_c$ is the critical current density and $\lambda_J$ is the Josephson penetration depth.

Figure 4:
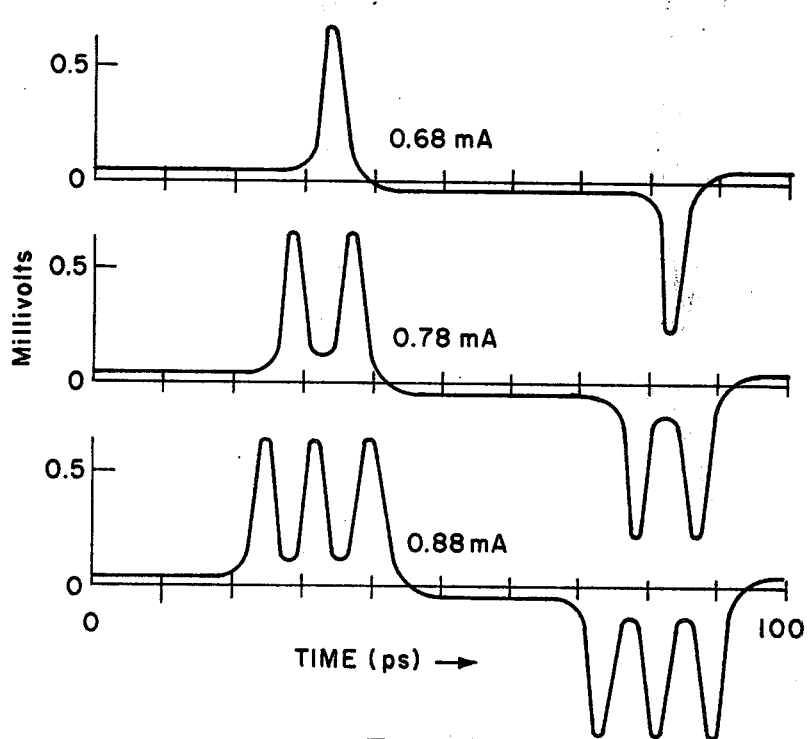
FIG. 4 shows examples of the voltage pulses produced by the pulse generating circuit for several values of $I_1$ for one complete cycle of the driving voltage.

FIG. 4 shows examples of single, double and triple pulses for a Josephson junction where the critical current $I_c = 0.6$ ma and the internal resistance of the junction $R_{int}$ equals 3.3 ohms with $R_L$, the external resistance equal to 0.59 ohms and driven at 10 $GH_z$. The drive current amplitude $I_1$ is indicated on the three curves. One complete cycle is shown, and it will be seen that the pulses are approximately 2 picoseconds wide, and that the polarity of the pulses corresponds to that of the driving current.

What is claimed is:

1. In a method of operating a Josephson junction so as to generate picosecond pulses the steps of
    shunting the Josephson junction with only a load resistor; and
    supplying a high frequency variable amplitude bias current to said Josephson junction,
        the amplitude of said bias current being selected so as to exceed the critical current of said Josephson junction by an amount depending upon the number of picosecond pulses which are to be generated across said load resistor during each half cycle of said bias current.

2. A picosecond width pulse generator, comprising in combination
    a Josephson junction;
    an external load resistor connected across said junction; and
    means for supplying a high frequency AC current to said Josephson junction,
        a portion of said AC current flowing through the parallel path provided by said external resistance.
        the amplitude of said high frequency AC current being such that at least one picosecond pulse is produced across said resistor during each half cycle of said high frequency AC current.

3. In a method for operating a Josephson junction so as to generate picosecond pulses, the steps of
    providing a shunt path for said Josephson junction containing a load resistor; and
    feeding a high frequency AC current to said Josephson junction whose amplitude is such that the current flowing through said Josephson junction exceeds the critical current of said Josephson junction,
        the amount by which the AC current fed to said Josephson junction exceeds said critical current determining the number of picosecond pulses generated across said resistor during each half cycle of said AC current.

4. Apparatus for generating picosecond pulses, comprising in combination
a Josephson junction;
a load resistor connected across said Josephson junction;
a microwave oscillator; and
means for connecting said microwave oscillator across said Josephson junction,
said microwave oscillator feeding an AC current to said Josephson junction whose amplitude exceeds the critical current of said Josephson junction by a preselected amount determined by the number of picosecond pulses that are to be produced across said resistor during each half cycle of said microwave oscillator.

5. In an arrangement as defined in claim 4 wherein the AC current has a value such that a plurality of pulses are produced during each half cycle of said microwave oscillator.

6. In an arrangement as defined in claim 4 wherein said load resistor and said microwave oscillator are connected across said Josephson junction by balanced transmission lines.

7. In an arrangement as defined in claim 6 wherein the balanced transmission line connecting said microwave oscillator across said Josephson junction includes microstriplines made of Pb alloy.

* * * * *